United States Patent
Kang

(10) Patent No.: US 8,767,474 B2
(45) Date of Patent: Jul. 1, 2014

(54) NONVOLATILE MEMORY DEVICE AND METHOD FOR CONTROLLING THE SAME

(75) Inventor: Hee Bok Kang, Cheongju-si (KR)

(73) Assignee: SK Hynix Inc., Icheon (KR)

( * ) Notice: Subject to any disclaimer, the term of this patent is extended or adjusted under 35 U.S.C. 154(b) by 20 days.

(21) Appl. No.: 13/605,754

(22) Filed: Sep. 6, 2012

(65) Prior Publication Data

US 2013/0329502 A1     Dec. 12, 2013

(30) Foreign Application Priority Data

Jun. 8, 2012   (KR) .................. 10-2012-0061787

(51) Int. Cl.
*G11C 16/04*     (2006.01)

(52) U.S. Cl.
USPC ............................ 365/185.19; 365/185.18

(58) Field of Classification Search
USPC ................. 365/185.19, 185.18, 185, 17
See application file for complete search history.

(56) References Cited

U.S. PATENT DOCUMENTS

| | | | |
|---|---|---|---|
| 2008/0181011 A1* | 7/2008 | Cho et al. | 365/185.18 |
| 2011/0085379 A1 | 4/2011 | Kim | |
| 2012/0008406 A1 | 1/2012 | Lee | |
| 2012/0113740 A1* | 5/2012 | Lee | 365/230.06 |

* cited by examiner

*Primary Examiner* — Huan Hoang

(57) ABSTRACT

A nonvolatile memory device and a method for controlling the same are provided relating to a flash memory device. The nonvolatile memory device includes a page buffer configured to store program bits, an incremental step pulse program (ISPP) control unit configured to count the program bits stored in the page buffer and control ISPP levels differently depending on change of the program bits, and an ISPP driving unit configured to drive an ISPP voltage in response to an output signal of the ISPP control unit.

19 Claims, 6 Drawing Sheets

PAGE BUFFER | 0 | 0 | 0 | 0 | 0 | 0 | 0 | 0 | 0 | 0 | 0 | 0 | 0 | 0 | 0 | • • •

(a) PROGRAM DATA LATCH SET TO BE ALL DATA "0"

PAGE BUFFER | 0 | 1 | 0 | 0 | 0 | 1 | 0 | 0 | 0 | 0 | 1 | 0 | 0 | 0 | 0 | • • •

(b) PROGRAM DATA LATCH AFTER FIRST ISPP (ISPP1)

PAGE BUFFER | 0 | 1 | 0 | 1 | 0 | 1 | 0 | 1 | 0 | 0 | 1 | 0 | 0 | 0 | 1 | • • •

(c) PROGRAM DATA LATCH AFTER SECOND ISPP (ISPP2)

•
•
•

PAGE BUFFER | 1 | 1 | 1 | 1 | 1 | 1 | 1 | 1 | 1 | 1 | 1 | 1 | 1 | 1 | 1 | • • •

(n) PROGRAM DATA LATCH AFTER NTH ISPP (ISPPn)

Fig.3

NONVOLATILE MEMORY DEVICE AND METHOD FOR CONTROLLING THE SAME

CROSS-REFERENCE TO RELATED APPLICATION

The priority of Korean patent application No. 10-2012-0061787 filed on Jun. 8, 2012 the disclosure of which is hereby incorporated in its entirety by reference, is claimed.

BACKGROUND OF THE INVENTION

The present invention relates generally to a nonvolatile memory device and a method for controlling the same, and more specifically, to a technology for controlling an incremental step pulse program (ISPP) operation in a flash memory device.

Semiconductor memory devices are memory devices configured to store data and read the stored data when necessary. Generally, semiconductor memory devices may include volatile memory devices and nonvolatile memory devices.

Volatile memory devices lose stored data in the absence of supplied power. In such volatile memory devices, data reading and writing speeds are fast, but the stored data is erased when the device is not powered.

Nonvolatile memory devices maintain stored data even when not powered. Thus, the nonvolatile memory devices are used to preserve data regardless of power supply.

Examples of nonvolatile memory devices may include a mask read-only memory (MROM) device, a programmable read-only memory (PROM) device, an erasable and programmable read-only memory (EPROM) device, an electrically erasable programmable read-only memory (EEPROM) device, and a flash memory device.

In MROM, PROM and EPROM devices, an erase operation and a writing operation are not flexible, and it is difficult for general users to change memorized contents. On the other hand, the erase and writing operations can be electrically performed in an EEPROM device. Thus, the EEPROM device has been applied to system programming which requires continuous renewal or has been widely used as a subsidiary memory device.

Since flash memory devices have a higher degree of integration than a conventional EEPROM device, they are particularly advantageous in the application to subsidiary memory devices of high capacity. Of these flash memory devices, a NAND-type flash memory device has a very high degree of integration.

In the flash memory device, data writing and erase operations are electrically performed. A memory cell array of the flash memory device includes a plurality of blocks, each block includes a plurality of pages, and each page includes a plurality of memory cells. The block is a minimum unit to erase data stored in the memory cell array.

In a program or erase operation, the flash memory device employs a tunneling effect, to allow carriers to pass through a high energy barrier, and a hot carrier effect, to allow hot carriers having a high moving energy to pass through an insulating material.

Such a program or erase operation is a factor that limits the amount of data to be recorded in flash memory cells and causes mis-operation of flash memory cells in a data writing operation.

Also, defects may be generated in the flash memory cells by a plurality of restraints in a manufacturing process of a flash memory device that requires a high degree of integration.

In a NAND-type flash memory device, when data is written in a memory cell, a previously stored marginal value level of the memory cell may be changed by a mis-operation or a write effect of adjacent cells. If the previously stored marginal value level is changed, the accuracy of data may be degraded.

Moreover, a program progress speed in a block may vary for each page even in one chip when a program operation is performed. In another chip, such program progress speed may vary depending on a manufacturing process and characteristics of the device.

BRIEF SUMMARY OF THE INVENTION

Embodiments of the present invention are directed to a technology for extracting an incremental step pulse program (ISPP) level having an optimum operation condition depending on a count value of program bits in a page buffer to perform a program operation, thereby obtaining an optimum distribution property of a cell threshold voltage.

According to an embodiment of the present invention, a nonvolatile memory device comprises: a page buffer configured to store program bits in a program mode; an incremental step pulse program (ISPP) control unit configured to count the program bits stored in the page buffer and control an ISPP level in response to a counted number of the program bits; and an ISPP driving unit configured to drive an ISPP voltage in response to the ISPP level controlled by the ISPP control unit, wherein a level of the ISPP voltage changes to perform each step of an ISPP operation.

The ISPP control unit comprises: a counter unit configured to count the program bits stored in the page buffer; a reference register unit configured to store a counted number of initial program bits that are initially stored in the page buffer in the program mode; a program bit register unit configured to store a varying counted number of program bits stored in the page buffer the number of program bits stored in the page buffer varying as each step of the ISPP operation is performed; and an ISPP level operation unit configured to control the ISPP level in response to an output signal of the reference register unit and an output signal of the program bit register unit.

The initial program bits are loaded into the page buffer from a data control unit in the program mode.

The varying counted number of program bits, which remain in the page buffer after each step of the ISPP is performed, is the number of data "0".

The program bits are data "0."

An operation of the ISPP control unit is terminated when the varying counted number of program bits is 0.

The ISPP control unit advances an ISPP step number to perform a next step of the ISPP operation when the varying counted number of program bits is not 0.

The ISPP control unit controls the ISPP levels differently depending on a count speed of the program bits.

A current ISPP level, which corresponds to a current step of the ISPP operation, is determined by a functional relationship between a previous ISPP level and a previous varying counted number of program bits, which correspond to a previous step of the ISPP operation.

The ISPP level is determined as follows: ISPPn level=f{PBC(n−1)}*ISPP(n−1)level+ISPP(n−1) level, wherein the ISPPn level represents an nth ISPP level, the ISPP(n−1) level represents a (n−1)th ISPP level, and the PBC(n−1) represents a varying counted number of program bits corresponding to a (n−1)th step of the ISPP operation, n being a positive integer.

According to an embodiment of the present invention, a method for controlling a nonvolatile memory device comprises: counting initial program bits stored in a page buffer in a program mode, and storing a counted number of the initial program bits in a reference register unit; performing a first step of an ISPP operation in response to an output signal of the reference register unit; counting a varying number of program bits stored in the page buffer, which varies after the first step of the ISPP operation is performed, and storing a varying counted number of program bits in a program bit register unit; adjusting an ISPP level in response to the output signal of the reference register unit and an output signal of the program bit register unit; and driving an ISPP voltage in response to the ISPP level to perform a current step of the ISPP operation.

The method further comprises loading the initial program bits into the page buffer from a data control unit in the program mode.

The storing of the varying counted number includes counting and storing the number of data "0" remaining after performing the first step of the ISPP operation.

The program bits are data "0."

The method further comprises determining whether the varying counted number of program bits is 0; and terminating the program mode if the varying counted number of program bits is 0.

The method further comprises advancing an ISPP step number to perform the current step of the ISPP operation if the varying counted number of program bits is not 0.

The ISPP step increases depending on the count value of the program bits.

The ISPP-level is controlled differently depending on a count speed varying counted number of program bits.

A current ISPP level, which corresponds to the current step of the ISPP operation, is determined by a functional relationship between a previous ISPP level and a previous varying counted number of program bits, which correspond to the previous step of the ISPP operation.

The ISPP level is determined as follows: ISPPn level=f{PBC(n−1)}*ISPP(n−1)level+ISPP(n−1) level, wherein the ISPPn level represents an nth ISPP level, the ISPP(n−1) level represents a (n−1)th ISPP level, and the PBC(n−1) represents a varying counted number of program bits corresponding to a (n−1)th step of the ISPP operation, n being a positive integer.

BRIEF DESCRIPTION OF THE DRAWINGS

FIG. 3 illustrates a diagram of a phase change in program data latched in a page buffer of FIG. 1.

DESCRIPTION OF EMBODIMENTS

Exemplary embodiments of the present invention will be described in detail with reference to the attached drawings.

Figure 1:
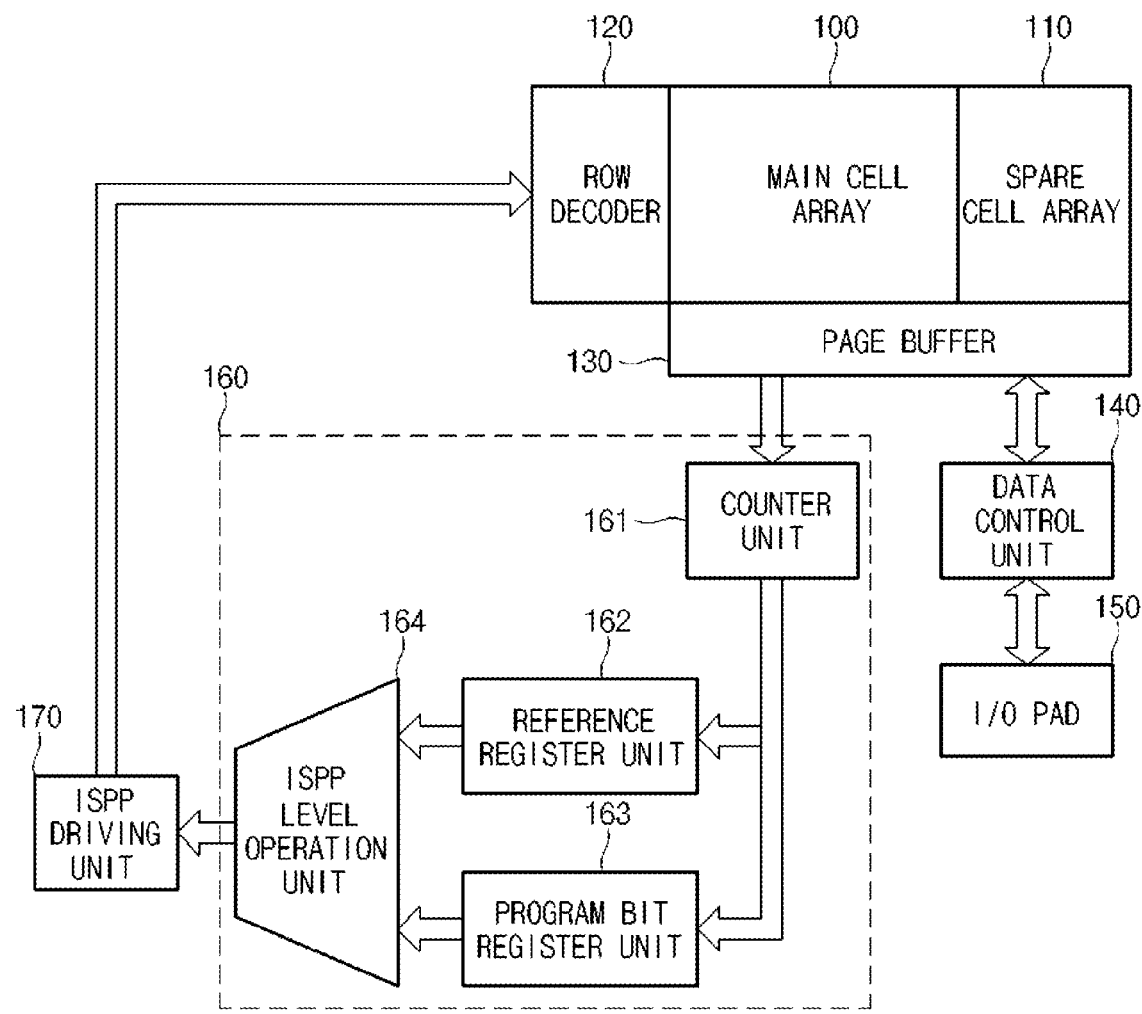
FIG. 1 illustrates a diagram of a nonvolatile memory device according to an embodiment of the present invention.

FIG. 1 illustrates a diagram of a nonvolatile memory device according to an embodiment of the present invention.

Referring to FIG. 1, the nonvolatile memory device includes a main cell array 100, a spare cell array 110, a row decoder 120, a page buffer 130, a data control unit 140, an input/output (I/O) pad 150, an incremental step pulse program (ISPP) control unit 160, an ISPP driving unit 170.

The ISPP control unit 160 includes a counter unit 161, a reference register unit 162, a program bit register unit 163, and an ISPP level operation unit 164.

The main cell array 100 includes a plurality of memory blocks coupled to bit lines and word lines. Each memory block includes a plurality of cell strings.

The spare cell array 110, located in an expanded cell array region of the main cell array 100, stores spare cell information.

The row decoder 120 coupled to memory blocks enables a target word line of a selected memory block in response to an address.

When the selected memory block is enabled by a block selection switch, word lines included in the selected memory block are coupled to global word lines to which an operating voltage is provided. The operating voltage is supplied by the ISPP driving unit 170.

The page buffer 130, coupled to bit lines of the main cell array 100, operates as a write driver or a sense amplifier depending on operation modes.

Also, the page buffer 130 controls a sensing operation and a program operation of the main cell array 100 and the spare cell array 110. For example, the page buffer 130 operates as a sense amplifier in a read mode and as a write driver in a program mode.

The data control unit 140 controls data input and data output in response to an I/O control signal. The data control unit 140 exchanges I/O data with an external device or system through the I/O pad 150.

The data control unit 140 transmits data of the main cell array 100 to the external system through the I/O pad 150. The data control unit 140 also transmits data received through the I/O pad 150 from the external system to the page buffer 130. Program data inputted through the I/O pad 150 and the data control unit 140 is stored in a program data latch of the page buffer 130.

The ISPP control unit 160 counts program bits stored in the main cell array 100 and outputs an ISPP level.

The ISPP driving unit 170 drives an ISPP voltage in response to the ISPP level of the ISPP control unit 160 and outputs the ISPP voltage to the row decoder 120.

Recently, in order to improve a degree of integration of a semiconductor memory device, a multi-level cell, which can store a plurality of bits of data determined by a plurality of threshold voltage levels, has been developed. In comparison with the multi-level cell, a single-level cell can store one bit of data determined by a single threshold voltage level.

As the number of threshold voltage levels that the multi-level cell can have increases, the data storage capacity of memory cells also increases. When a plurality of memory cells is programmed to a state targeted to a specific threshold voltage level, threshold voltages of the memory cells may be distributed with various levels.

Moreover, as an interval between neighboring threshold voltages becomes narrower, the distribution width of threshold voltages of memory cells in the semiconductor memory device is also made narrower so as to improve reliability of data. For this purpose, an increment step pulse program (ISPP) method has been widely used.

According to the ISPP method, a level of a program voltage gradually increases starting from a previously set start voltage level by a step voltage level unit. After each program operation is performed, a program verification operation is performed to exclude programmed memory cells from a subsequent program operation. That is, verification voltages for the program verification operation are sequentially applied to memory cells after a program voltage is applied.

In an embodiment of the present invention, in order to control an ISPP operation, the counter unit 161 counts program bits stored in the program data latch of the page buffer 130. In an embodiment of the present invention, the program bits to be counted during the program operation are defined as data "0."

The reference register unit 162 stores the number of initial program bits stored in the program data latch of the page buffer 130 before the ISPP operation is performed.

The program bit register unit 163 stores the varying number of program bits, which varies as each step of the ISPP operation is performed.

The ISPP level operation unit 164 compares an output signal of the reference register unit 162 with an output signal of the program bit register unit 163 so as to output an optimum ISPP level.

The ISPP driving unit 170 controls a level of the ISPP voltage in response to the optimum ISPP level output from the ISPP level operation unit 164 and supplies the ISPP voltage to the row decoder 120. The ISPP driving unit 170 can change a driving voltage of the row decoder 120 in the program mode in response to the ISPP level output from the ISPP level operation unit 164.

For example, the ISPP driving unit 170 changes a driving voltage or a verification voltage of a word line depending on a voltage level altered by the ISPP level operation unit 164 during the program operation and supplies the changed voltage to the row decoder 120.

Figure 2:
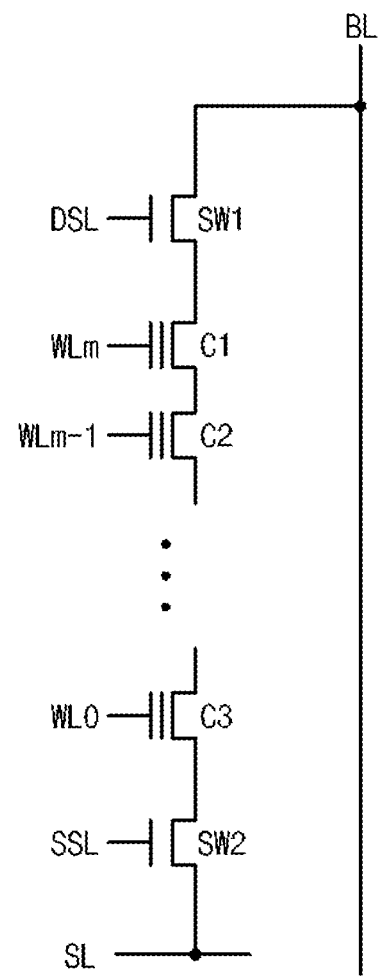
FIG. 2 illustrates a circuit diagram of a cell string in a main cell array of FIG. 1.

FIG. 2 illustrates a circuit diagram of a cell string in the main cell array 100 of FIG. 1.

In the main cell array 100, a plurality of cells C1~C3 is serially coupled to constitute the cell string. Each of the cells C1~C3 has a control gate coupled to its corresponding word line WL.

A first switching element SW1 has one terminal coupled to one terminal of the first cell C1 of the plurality of cells C1~C3 and the other terminal coupled to a bit line BL. A gate of the first switching element SW1 is coupled to a data selection line DSL.

A second switching element SW2 has one terminal coupled to one terminal of the last cell C3 of the plurality of cells C1~C3 and the other terminal coupled to a source line SL. A gate of the second switching element SW2 is coupled to a source selection line SSL.

FIG. 3 illustrates a diagram of a phase change in program data latched in the page buffer 130 of FIG. 1.

When an erase operation is performed on a certain cell block, all cells in the cell block enter erased phases, e.g., data "1." After that, a program operation is performed to write data "0" in the cell block.

In order to perform the program operation, data to be programmed is input to the cell block from the program data latch of the page buffer 130.

For example, in FIG. 3, the step (a) represents one data pattern when data "0" is programmed in the program data latch of the page buffer 130.

The step (b) represents a status that data "1" is stored in the program data latch of the page buffer 130 depending on a program verification result after a first step ISPP1 of an ISPP operation is performed.

In the step (b), it is shown that a status of a portion of the program data latch changes from a data "0" status into a data "1" status after a first ISPP voltage is applied. This means that the program operation is completed on cells that have been changed into the data "1" status.

The step (c) represents a status that data "1" is stored in the program data latch of the page buffer 130 depending on a program verification result after a second step ISPP2 of the ISPP operation is performed.

In the step (c), it is shown that a status of an additional portion of the program data latch changes from the data "0" status into the data "1" status after a second ISPP voltage is applied. This means that the program operation is completed on cells that have been additionally changed into the data "1" status.

The step (n) represents a status that data "1" is stored in the overall program data latch of the page buffer 130 depending on a program verification result after an $n^{th}$ step ISPPn of the ISPP operation is performed.

In the step (n), it is shown that a status of the overall program data latch change from the data "0" status into the data "1" status after an $n^{th}$ ISPP voltage is applied. This means that the program operation is completed on the overall cells in the cell block.

Figure 4:
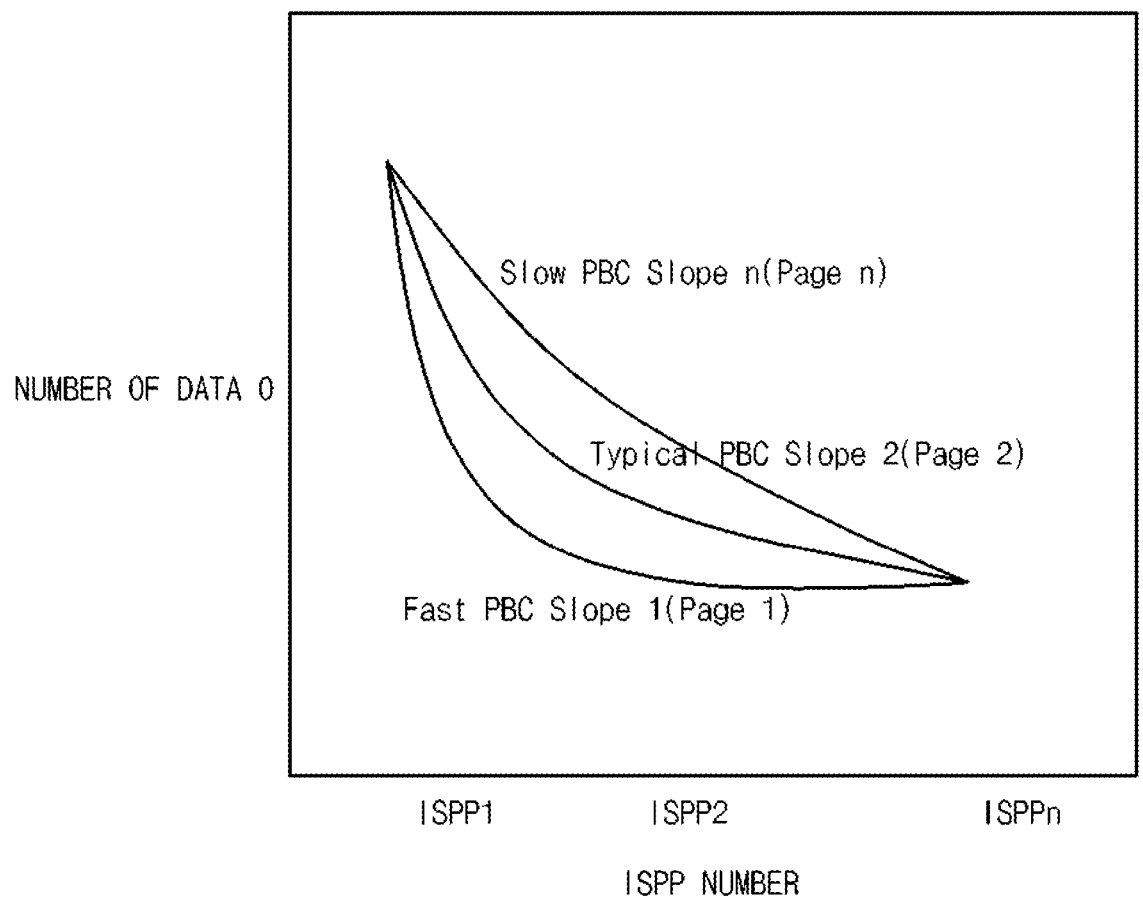
FIG. 4 illustrates a slope change characteristic of a counter unit depending on an ISPP number.

FIG. 4 illustrates a slope change characteristic of the counter unit 161 depending on an ISPP step number.

When a program operation is performed, a program progress speed in a block may vary for each page, even in one chip. In another chip, such a program progress speed may vary depending on a manufacturing process and characteristics of a device.

As a result, in an embodiment of the present invention, data "0" to be programmed is defined as a program bit, and the counter unit 161 counts program bits in the page buffer 130.

Thus, if the program operation is performed with the same ISPP voltage slope, the counted number of program bits in the page buffer 130 varies in each page corresponding to each ISPP operation.

Referring to FIG. 4, an axis Y represents a counted number of program bits of data "0," and an axis X represents the number of steps of an ISPP operation, i.e., the ISPP number.

In the case of a random page 1, since the counted number of program bits changes fast, the page 1 is defined as a fast program bit count (PBC) slope 1. In the case of a random page 2, since the counted number of program bits moderately changes, the page 2 is defined as a moderate PBC slope 2. Also, in the case of a random page n, since the counted number of program bits slowly changes, the page n is defined as a slow PBC slope n.

Figure 5:
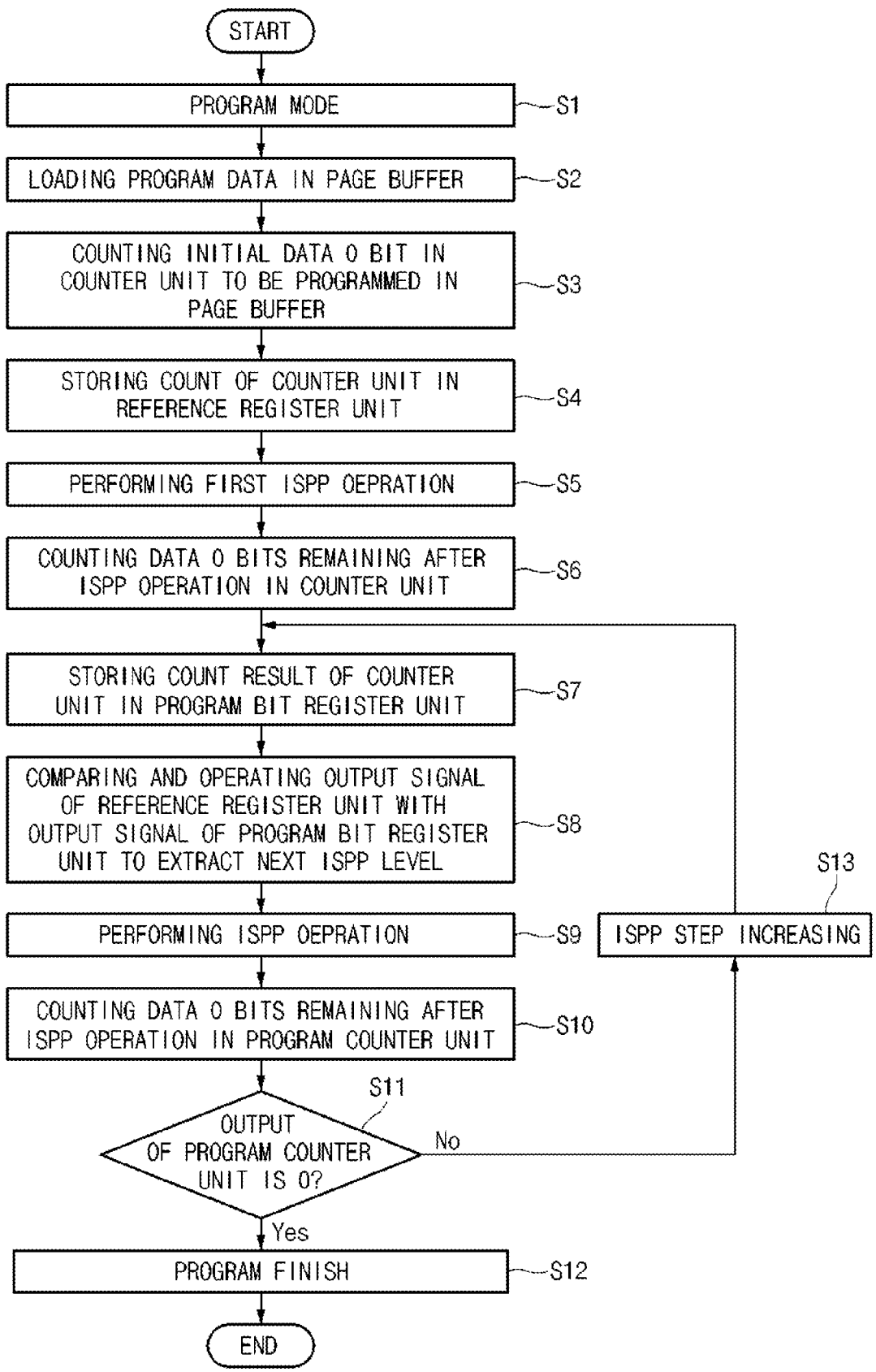
FIG. 5 illustrates a method for controlling a nonvolatile memory device according to an embodiment of the present invention.

FIG. 5 illustrates a method for controlling a nonvolatile memory device according to an embodiment of the present invention. The method will be described with reference to FIGS. 1 and 3.

If a program mode starts in step S1, program data is loaded into the program data latch of the page buffer 130 through the data control unit 140 in step S2.

The counter unit 161 counts initial program bits of data "0" stored in the program data latch of the page buffer 130 in step S3. That is, the counter unit 161 counts program bits of data "0" first inputted to the page buffer 130 after the program mode started.

For example, the counter unit 161 counts the number of data "0" stored in the program data latch of the page buffer 130, as shown in (a) of FIG. 3.

A first count result of the counter unit 161 is stored in the reference register unit 162 in step S4.

The ISPP level operation unit 164 controls an ISPP operation level in response to an output signal of the reference register unit 162 to output a level operation result to the ISPP driving unit 170. By control of the ISPP driving unit 170, the first step of the ISPP operation is performed in step S5.

The counter unit 161 counts data "0" bits that remain after the first step of the ISPP operation in step S6. For example, as shown in (b) of FIG. 3, the counter unit 161 counts the number of data "0" remaining in the program data latch of the page buffer 130. The number of data "0" remaining after the first step of the ISPP operation is reduced as shown in (b) of FIG. 3 compared to the number of data "0" in (a) of FIG. 3.

A count result of the step S6 is stored in the program bit register unit 163 in step S7.

The ISPP level operation unit 164 compares an output signal of the reference register unit 162 with an output signal of the program bit register unit 163 so as to extract a next ISPP level in step S8.

Subsequently, the ISPP driving unit 170 operates in response to the next ISPP level. Depending on the control of the ISPP driving unit 170, the next step, i.e., a second step, of the ISPP operation is performed in step S9.

The counter unit 161 continuously counts data "0" bits that remain after the second step of the ISPP operation in step S10. For example, as shown in (c)~(n) of FIG. 3, data "0" stored in the program data latch of the page buffer 130 is counted. The count result output from the counter unit 161 is stored in the program bit register unit 163.

Then, it is determined whether the count result of the counter unit 161 is 0 or not in step S11. If the count result of the counter unit 161 is 0, then the number of data "0" that remains after a $n^{th}$ step of the ISPP operation is performed is 0 as shown in (n) of FIG. 3.

If the count result of the counter unit 161 is 0, the counter unit 161 does not perform a count operation any more, so that the program operation is finished in step S12. That is, when the count result of the counter unit 161 is 0, it means that there are no more cells to be programmed, so that the program operation is terminated.

On the other hand, when the count result of the counter unit 161 is not 0, the ISPP step number is advanced in step S13. That is, when the count result of the counter unit 161 is not 0, it means that there are more cells to be programmed. As a result, the ISPP driving unit 170 adjusts an ISPP voltage level depending on the ISPP level determined by the ISPP level operation unit 164 so as to perform the ISPP operation.

Figure 6:
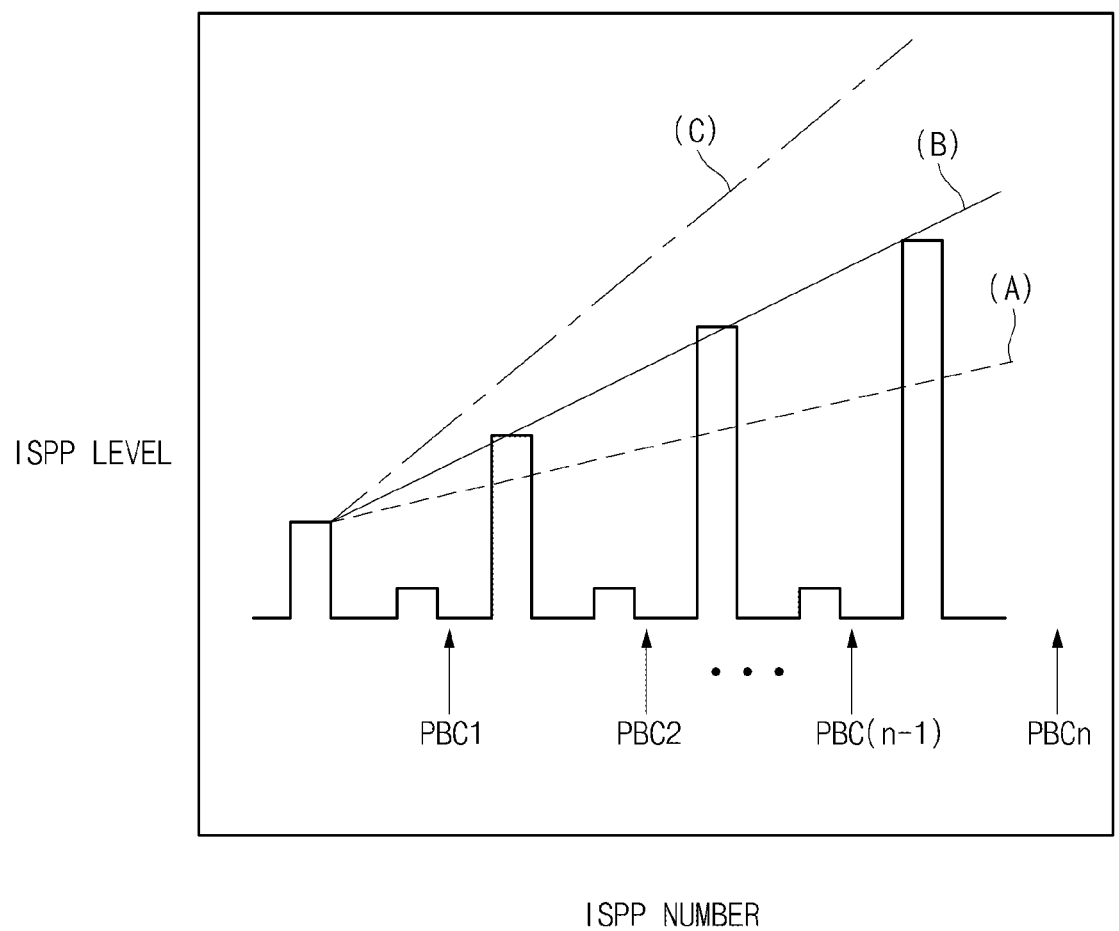
FIG. 6 illustrates characteristics of an ISPP level slope applied in response to an output signal of a counter unit in accordance with an embodiment of the present invention.

FIG. 6 illustrates characteristics of an ISPP level slope applied in response to an output signal of the counter unit 161.

The slope control of the ISPP level can be performed by the ISPP level operation unit 164.

As described above, when a program operation is performed, a program progress speed in a block may vary for each page even in one chip. In another chip, such a program progress speed may vary depending on a manufacturing process and characteristics of a device.

The program progress speed is defined by the following equation.

$$\text{ISPPn level} = f\{PBC(n-1)\} * ISPP(n-1)\text{level} + ISPP(n-1)$$

level, wherein PBC represents a counted number of program bits, n being a positive integer.

As shown in the above equation, the $n^{th}$ ISPP (ISPPn) level may be represented by a functional relationship between a (n−1)th ISPP level, i.e., the ISPP(n−1) level, and a (n−1)th PBC value, i.e., PBC(n−1).

That is, an ISPP level of a current step may be determined by the ISPP(n−1) level, which is an ISPP level of the previous step, and its related $(n-1)^{th}$ PBC value.

In this way, in a cell where the program operation is performed at a fast speed, the counted number of program bits varies at a fast speed. As a result, in order to stabilize the distribution of cell threshold voltages (Vt), the ISPP level is controlled to be small for each program step, as shown in (A) of FIG. 6.

On the other hand, in a cell where the program operation is performed at a slow speed, the counted number of program bits varies at a slow speed. As a result, in order to stabilize the distribution of cell threshold voltages (Vt), the ISPP level is controlled to be large for each program step, as shown in (C) of FIG. 6.

Also, in a cell where the program operation is performed at a moderate speed, the counted number of program bits varies at a moderate speed. As a result, in order to stabilize the distribution of cell threshold voltages (Vt), the ISPP level is controlled at a moderate level for each program step, as shown in (B) of FIG. 6.

Thus, the nonvolatile memory device according to an embodiment of the present invention provides advantages by making it possible to extract an incremental step pulse program (ISPP) level having an optimum operation condition depending on a counted number of program bits in a page buffer to perform a program operation, thereby obtaining an optimum distribution property of cell threshold voltages.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A nonvolatile memory device, comprising:
a page buffer configured to store program bits in a program mode;
an incremental step pulse program (ISPP) control unit configured to count the program bits stored in the page buffer and control an ISPP level in response to a counted number of the program bits; and
an ISPP driving unit configured to drive an ISPP voltage in response to the ISPP level controlled by the ISPP control unit, wherein a level of the ISPP voltage changes to perform each step of an ISPP operation;
wherein the ISPP control unit comprises:
a counter unit configured to count the program bits stored in the page buffer;
a reference register unit configured to store a counted number of initial program bits that are initially stored in the page buffer in the program mode;
a program bit register unit configured to store a varying counted number of program bits stored in the page buffer, the number of program bits stored in the page buffer varying as each step of the ISPP operation is performed; and
an ISPP level operation unit configured to control the ISPP level in response to an output signal of the reference register unit and an output signal of the program bit register unit.

2. The nonvolatile memory device according to claim 1, wherein the initial program bits are loaded into the page buffer from a data control unit in the program mode.

3. The nonvolatile memory device according to claim 1, wherein the varying counted number of program bits, which remain in the page buffer after each step of the ISPP is performed, is the number of data "0".

4. The nonvolatile memory device according to claim 1, wherein the program bits are data "0".

5. The nonvolatile memory device according to claim 1, wherein an operation of the ISPP control unit is terminated when the varying counted number of program bits is 0.

6. The nonvolatile memory device according to claim 1, wherein the ISPP control unit advances an ISPP step number to perform a next step of the ISPP operation when the varying counted number of program bits is not 0.

7. The nonvolatile memory device according to claim 1, wherein the ISPP control unit controls the ISPP level differently depending on a count speed of the program bits.

8. The nonvolatile memory device according to claim 1, wherein a current ISPP level, which corresponds to a current step of the ISPP operation, is determined by a functional relationship between a previous ISPP level and a previous varying counted number of program bits, which correspond to a previous step of the ISPP operation.

9. The nonvolatile memory device according to claim 8, wherein the ISPP level is determined as follows:

$$\text{ISPP}n\text{ level}=f\{\text{PBC}(n-1)\}*\text{ISPP}(n-1)\text{level}+\text{ISPP}(n-1)\text{level},$$

wherein the ISPPn level represents an nth ISPP level, the ISPP(n−1) level represents a (n−1)th ISPP level, and the PBC(n−1) represents a varying counted number of program bits corresponding to a (n−1)th step of the ISPP operation, n being a positive integer.

10. A method for controlling a nonvolatile memory device, the method comprising:
counting initial program bits stored in a page buffer in a program mode, and storing a counted number of the initial program bits in a reference register unit;
performing a first step of an ISPP operation in response to an output signal of the reference register unit;
counting a varying number of program bits stored in the page buffer, which varies after the first step of the ISPP operation is performed, and storing a varying counted number of program bits in a program bit register unit;
adjusting an ISPP level in response to the output signal of the reference register unit and an output signal of the program bit register unit; and
driving an ISPP voltage in response to the ISPP level to perform a current step of the ISPP operation.

11. The method according to claim 10, further comprising loading the initial program bits into the page buffer from a data control unit in the program mode.

12. The method according to claim 10, wherein the storing of the varying counted number includes counting and storing the number of data "0" remaining after performing the first step of the ISPP operation.

13. The method according to claim 10, wherein the program bits are data "0."

14. The method according to claim 10, further comprising:
determining whether the varying counted number of program bits is 0; and
terminating the program mode if the varying counted number of program bits is 0.

15. The method according to claim 14, further comprising advancing an ISPP step number to perform the current step of the ISPP operation if the varying counted number of program bits is not 0.

16. The method according to claim 14, wherein the ISPP step increases depending on the count value of the program bits.

17. The method according to claim 10, wherein the ISPP level is controlled differently depending on a count speed of the varying counted number of program bits.

18. The method according to claim 10, wherein a current ISPP level, which corresponds to the current step of the ISPP operation, is determined by a functional relationship between a previous ISPP level and a previous varying counted number of program bits, which correspond to the previous step of the ISPP operation.

19. The method according to claim 18, wherein the ISPP level is determined as follows:

$$\text{ISPP}n\text{ level}=f\{\text{PBC}(n-1)\}*\text{ISPP}(n-1)\text{level}+\text{ISPP}(n-1)\text{level},$$

wherein the ISPPn level represents an nth ISPP level, the ISPP(n−1) level represents a (n−1)th ISPP level, and the PBC(n−1) represents a varying counted number of program bits corresponding to a (n−1)th step of the ISPP operation, n being a positive integer.

* * * * *